United States Patent [19]

Cafarella et al.

[11] Patent Number: 4,499,586
[45] Date of Patent: Feb. 12, 1985

[54] MICROPROCESSOR CONTROLLED AGC

[75] Inventors: Thomas Cafarella, East Northport; Mohamed Enein, Northport, both of N.Y.

[73] Assignee: Hazeltine Corporation, Commack, N.Y.

[21] Appl. No.: 470,830

[22] Filed: Feb. 28, 1983

[51] Int. Cl.³ .............................................. H04L 27/08
[52] U.S. Cl. ...................................... 375/98; 343/411; 455/239; 455/245
[58] Field of Search ................... 343/7 AG, 392, 400, 343/410, 411, 413; 364/571; 381/107, 108; 455/239, 245, 246, 247; 375/98; 328/173, 175; 307/540, 490, 492, 493

[56] References Cited

U.S. PATENT DOCUMENTS

| 2,788,450 | 4/1957 | Sunstein et al. | 343/392 |
| 4,099,124 | 7/1978 | Sharpe et al. | 375/98 |
| 4,184,158 | 1/1980 | Smith | 343/411 |
| 4,228,435 | 10/1980 | Nevin | 343/7 AG |

Primary Examiner—Benedict V. Safourek
Attorney, Agent, or Firm—E. A. Onders; F. R. Agovino

[57] ABSTRACT

A receiver for receiving recurring first and second scanning signals. The peak of successive first and second scanning signals is digitally detected and averaged. The gain of an amplifier of the receiver is controlled in response to the averaged peaks to anticipate the magnitude of the next scanning signal. As a result, recurring first and second scanning signals of significantly different magnitudes are received and processed by the receiver.

3 Claims, 2 Drawing Figures

MICROPROCESSOR CONTROLLED AGC

BACKGROUND OF THE INVENTION

1. Field of the Invention

The invention generally relates to receivers for receiving scanning signals and, in particular, to an apparatus which receives signals having a predetermined time varying format allowing prediction of appropriate AGC levels such as a microwave landing system (MLS) receiver for receiving scanning signals provided by an MLS ground system.

2. Description of the Prior Art

The International Civil Aviation Organization (ICAO) has adopted a time reference scanning beam (TRSB) technique as the standard for civil microwave landing systems. MLS ground systems provide elevation (EL) and azimuth (AZ) scanning beams, each including a TO scan followed by a FRO scan, defining the area of coverage of the ground system. An MLS receiver located in an aircraft receives the EL scan and AZ scans and is able to determine the azimuth and elevation locations of the aircraft with respect to the ground system.

Since MLS receivers must operate in a time division multiplex mode in which the relative amplitudes of successive signals of interest may vary greatly, the receiver must adjust for anticipated amplitude levels prior to an anticipated detection. Specifically, the appropriate automatic gain control (AGC) voltage must be applied to the amplifier of the receiver prior to the anticipated detection of each angle function.

SUMMARY OF THE INVENTION

It is an object of this invention to provide an MLS receiver with a microprocessor controlled automatic gain control.

The apparatus according to the invention is for receiving a first scanning signal followed by a second scanning signal. The apparatus includes an antenna for receiving the first and second scanning signals. Means are provided for converting each of the first and second scanning signals received by the antenna into a corresponding intermediate frequency signal. A linear amplifier having a variable gain first amplifies the corresponding intermediate frequency signals. A logarithmic amplifier then amplifies the linearly amplified signal. Means are provided for detecting the logarithmically amplified signal. An analog-to-digital converter converts the detected signal into corresponding digital information. A digital peak detector detects a peak magnitude of the corresponding digital information. First means are provided for developing a first average peak magnitude signal corresponding to the average of the magnitude of the detected peaks of the information corresponding to the first scanning signal. Second means are provided for developing a second average peak magnitude signal corresponding to the average of the magnitudes of the detected peaks of the information corresponding to the second scanning signal. Means, such as a digital microprocessor, provides a digital gain signal in response to the first and second average peak magnitude signals. The digital gain signal corresponding to the first average peak magnitude signal is provided during periods when the antenna is expected to be receiving the first scanning signal. The digital gain signal corresponding to the second average peak magnitude signal is provided during periods when the antenna is expected to be receiving the second scanning signal. A digital-to-analog converter converts the digital gain signal into a corresponding analog gain signal which is applied to the gain control input of the linear amplifier.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 1:
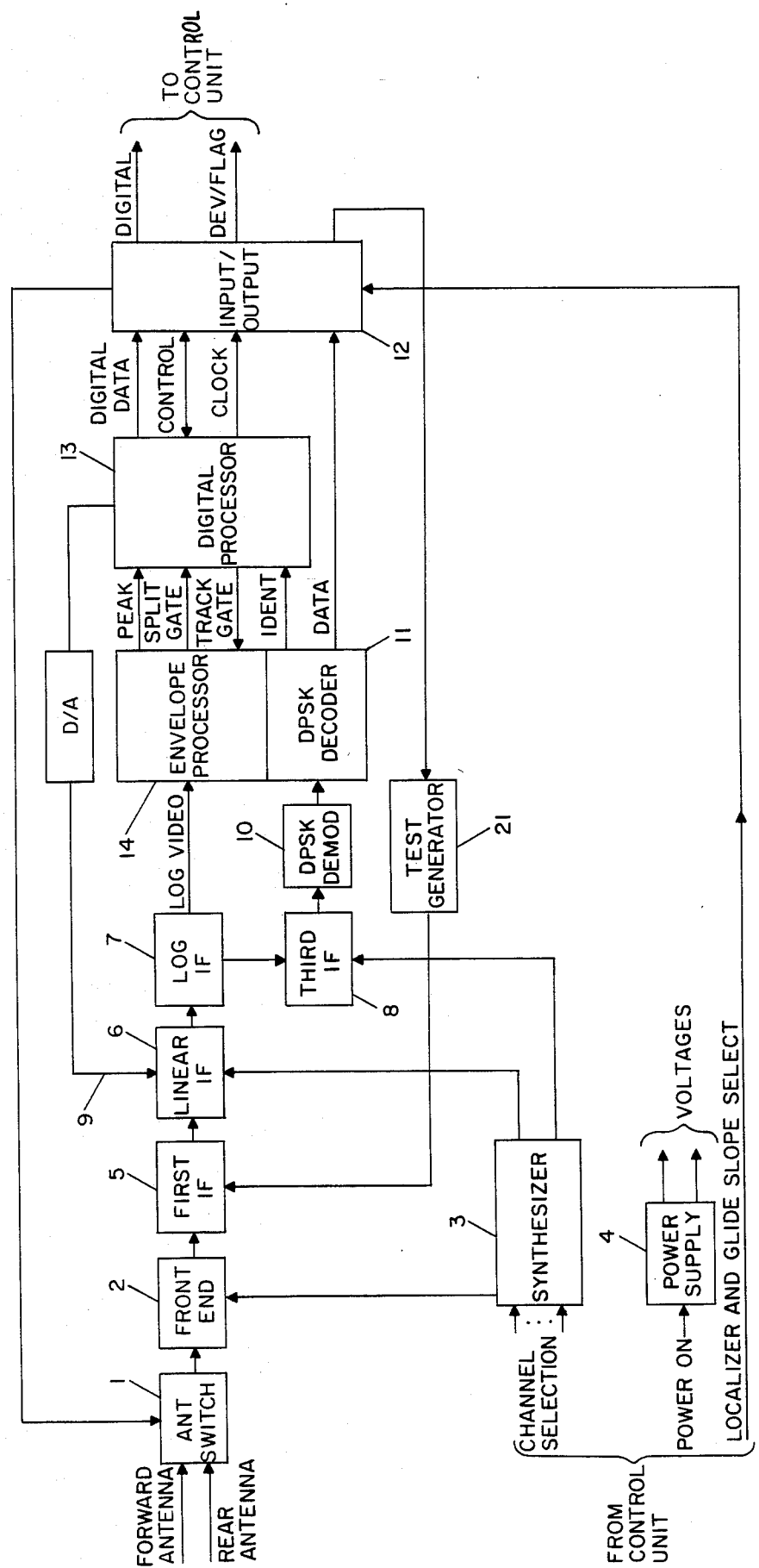
FIG. 1 is a block diagram of an MLS receiver.

As illustrated in FIG. 1, the MLS receiver is provided with an antenna switch 1 which connects either the forward antenna or the rear antenna to front end 2. A control unit (not shown) provides channel selection information to frequency synthesizer 3 which, in turn, provides the appropriate reference frequency to front end 2 for down conversion of the received radio frequency (RF) signal to an intermediate frequency (IF). The control unit also provides power "on" information to power supply 4 which supplies voltages to the various components of the receiver.

MLS receivers require an IF amplifier having a dynamic range which exceeds 80 dB. In order to achieve such a dynamic range, the receiver according to FIG. 1 includes an IF amplifier chain including a first IF amplifier 5 followed by a second IF amplifier consisting of linear IF amplifier 6 and logarithmic IF amplifier 7. The chain is followed by a third IF amplifier 8. Linear IF amplifier 6 and third IF amplifier 8 are provided with local oscillator (LO) frequencies by synthesizer 3 depending on the channel selection. This chain of amplifiers is designed with a linear-logarithmic response so that the logarithmic IF amplifier properties may be used without the difficulties attendant with an amplifier having a particular characteristic over the entire range.

For small signals, linear amplifiers 5 and 6 provide sufficient gain for the logarithmic IF amplifier 7 to operate within its range. As the signal level increases beyond an established level on an overall response curve of logarithmic IF amplifier 7, an AGC voltage is applied to linear IF amplifier 6 via line 9 to decrease the total gain of the linear amplifier so that logarithmic IF amplifier 7 is operating within its range. When the signal level provided by linear IF amplifier 6 decreases below an established level on the overall response curve of logarithmic IF amplifier 7, the AGC voltage remains constant and the gain of linear IF amplifier 16 is at a maximum. The result is that the first and linear IF amplifiers 5 and 6, respectively, maintain operation within the logarithmic response of the receiver characteristic as defined by logarithmic IF amplifier 7.

According to the ICAO standard, the scanning signals detected by to the receiver are encoded with differential phase shift keying (DPSK) data. The output of third IF amplifier 8 is provided to DPSK demodulator 10 which is followed by DPSK decoder 11 for demodulating and decoding the data provided to input/output 12. Localizer and glide slope select information from the control unit (not shown) along with the decoded data are provided to the input/output 12 which controls antenna switch 1 and the deviation or "flag" indicators of the receiver. Input/output 12 also provides digital information to the control unit and provides control information to digital processor 13.

Figure 2:
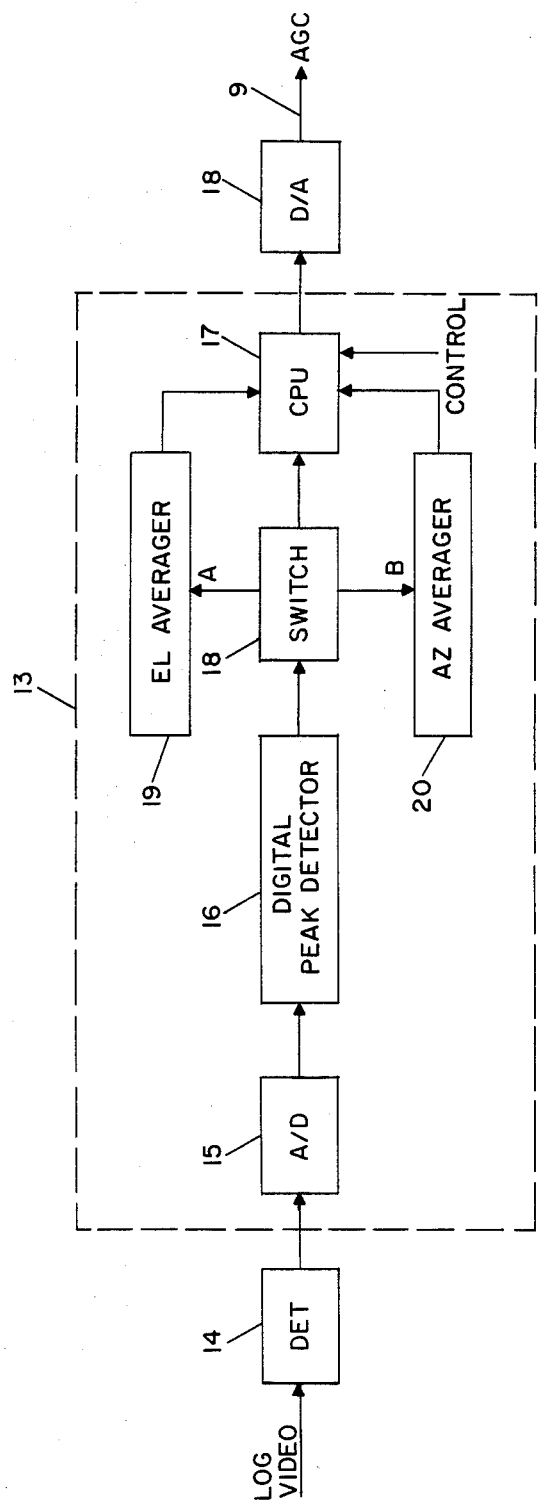
FIG. 2 is a block diagram of a microprocessor controlled automatic gain control for a receiver such as the MLS receiver illustrated in FIG. 1.

Logarithmic video information provided by logarithmic IF amplifier 7 is also provided to envelope processor 14. Since the receiver operates in a time division multiplexed mode in which the relative amplitudes of successive azimuth and elevation signals of interest may vary greatly but are predictable based on previously received signals, the previously received amplitude levels of the azimuth and elevation signals are stored for use in controlling the gain of linear IF amplifier 6. This allows the appropriate AGC voltage to be applied via line 9 prior to the anticipated detection of each angle function. Digital microprocessor 13 accomplishes this control. FIG. 2 illustrates in detail the portions in digital processor 13 which achieve this result.

The required AGC level is determined by noting the peak amplitude of the received signal during each AZ and EL scan. The past several peaks corresponding to each beam scan, i.e. azimuth or elevation, are averaged after the received signal has been digitized. The appropriate AGC voltage is then selected and applied via line 9 to second IF amplifier 6. In the acquisition phase, when the signal level may be expected to deviate considerably from the desired level, the ACG correction is made gradually over several beam scans. When no signal is being received, the IF gain of linear IF amplifier 6 is fixed at a maximum by the supplied AGC voltage. It remains at a maximum as a beam is sensed until a first received signal has been decoded by decoder 11. At that time, the appropriate AGC voltage based on the previous signal strength, i.e. the second received signal strength, is applied to linear IF amplifier 6 so that the amplifier gain is established prior to the commencement of the angle scan. The IF gain remains unchanged until a second received signal has been decoded.

In particular, as shown in FIG. 2, the logarithmic video information provided by logarithmic amplifier 7 is provided to envelope detector (processor) 14. The resulting detected signal is digitized by analog-to-digital converter 15 and this digitized information is provided to digital peak detector 16. Central processing unit 17 of digital microprocessor 13 controls switch 18 based on control information provided by input/output 12. During each "EL" scan period, switch 18 is in the A position so that the digital peak information detected by detector 16 is provided to EL averager 19. During the "AZ" scan period, CPU 17 places switch 18 in the B position so that the digital peak information for the received AZ scan period as detected by detector 16, is provided to AZ averager 20. The average peak amplitude of the elevation and azimuth scans is provided to CPU 17 which, in turn, determines the AGC voltage necessary to maintain operation of logarithmic amplifier 7 within the range of its logarithmic characteristic. CPU 17 provides a digital signal representing the required AGC voltage to digital-to-analog converter 18 which converts the digital signal into an analog AGC voltage for application to the control input of linear IF amplifier 6.

The receiver may also be provided with a test generator 21, as shown in FIG. 1, which is operated by input/output 12 in response to a test request from the control unit. Test generator 21 provides predetermined IF signals to the first IF amplifier 5 for initiating the test. Digital microprocessor 13 also provides digital data and clock information to input/output 12 and track gate information to envelope processor 14. Envelope processor 14 also provides split gate information to digital processor 13, and DPSK decoder 11 provides identification information to digital processor 13.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An apparatus for receiving recurring first and second scanning signal comprising:
   (a) means for receiving the first and second signals;
   (b) means for converting each of the received signals into a corresponding intermediate frequency signal;
   (c) a linear amplifier having a controllable gain input, said linear amplifier for amplifying said intermediate frequency signals;
   (d) a logarithmic amplifier for amplifying the linearly amplified signals;
   (e) means for detecting the logarithmically amplified signals;
   (f) an analog-to-digital converter for converting the detected signals into corresponding digital first and second signals;
   (g) a digital peak detector for detecting a peak magnitude of said digital first and second signals;
   (h) first means for providing a first average peak magnitude signal corresponding to an average of the magnitudes of the detected peaks of the digital signal corresponding to said received first signal;
   (i) second means for providing a second average peak magnitude signal corresponding to an average of the magnitudes of the detected peaks of the digital signal corresponding to said received second signal;
   (j) means for providing a digital gain control signal in response to the first and second average peak magnitude signals; and
   (k) digital-to-analog converter means for converting the first and second digital gain control signals into corresponding analog gain control signals which are applied to the gain control input of said linear amplifier.

2. The apparatus of claim 1 wherein said means for providing a digital gain control signal comprises a digital processor.

3. The apparatus of claim 2 further including a switch controlled by the digital processor for providing the first averager with the magnitude of the detected peaks of the digital information corresponding to the first scanning signals and for providing the second averager with the magnitude of the detected peaks of the digital information corresponding to the second scanning signal.

* * * * *